United States Patent
Ahmad et al.

(10) Patent No.: US 10,468,318 B2
(45) Date of Patent: Nov. 5, 2019

(54) STIFFENER FOR PROVIDING UNIFORMITY IN MICROELECTRONIC PACKAGES

(71) Applicant: CISCO TECHNOLOGY, INC., San Jose, CA (US)

(72) Inventors: Mudasir Ahmad, San Jose, CA (US); Weidong Xie, San Ramon, CA (US); Qiang Wang, Huzhou (CN); Yaoyu Pang, Katy, TX (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/881,896

(22) Filed: Jan. 29, 2018

(65) Prior Publication Data

US 2019/0237371 A1  Aug. 1, 2019

(51) Int. Cl.
| | |
|---|---|
| *H01L 25/065* | (2006.01) |
| *H01L 23/16* | (2006.01) |
| *H01L 23/00* | (2006.01) |
| *H01L 23/498* | (2006.01) |
| *H01L 21/56* | (2006.01) |

(52) U.S. Cl.
CPC ........ *H01L 23/16* (2013.01); *H01L 23/49838* (2013.01); *H01L 23/562* (2013.01); *H01L 24/16* (2013.01); *H01L 25/0655* (2013.01); H01L 2224/16225 (2013.01); H01L 2924/1433 (2013.01); H01L 2924/1434 (2013.01); H01L 2924/3511 (2013.01)

(58) Field of Classification Search
CPC ....... H01L 2924/00; H01L 2924/00014; H01L 2224/16225; H01L 2924/15311; H01L 2224/16227

USPC ........ 257/737, 712, 738, 774, 778; 438/107, 438/113, 106, 109
See application file for complete search history.

(56) References Cited

U.S. PATENT DOCUMENTS

| | | | | |
|---|---|---|---|---|
| 5,566,448 | A | * | 10/1996 | Bhatt .................. H01L 21/4857 257/E23.004 |
| 5,866,943 | A | | 2/1999 | Mertol |
| 6,049,972 | A | * | 4/2000 | Link ................. H01L 21/67346 29/825 |
| 8,174,114 | B2 | * | 5/2012 | Lee ......................... H01L 23/04 257/706 |
| 8,952,523 | B2 | | 2/2015 | Ahmad et al. |
| 9,026,872 | B2 | * | 5/2015 | Camarota ............. H01L 23/145 257/621 |
| 2004/0046248 | A1 | | 3/2004 | Waelti et al. |
| 2004/0150118 | A1 | * | 8/2004 | Honda .................. H01L 21/563 257/778 |

(Continued)

OTHER PUBLICATIONS

"COOL Substrate fo 2.5D Assembly", Lin et al., Bridge Semiconductor Corp., Taiwain, http://ieeexplore.ieee.org/abstract/document/7412354/, Dec. 2015.

*Primary Examiner* — Jonathan Han
(74) *Attorney, Agent, or Firm* — Cindy Kaplan

(57) ABSTRACT

In one embodiment, an apparatus includes a microelectronic package comprising a plurality of semiconductor chips connected to a substrate and a stiffener mounted on the substrate. The stiffener is mounted on the substrate with the semiconductor chips disposed within an opening in the stiffener and the opening defines an asymmetric shape relative to the semiconductor chips to control overall warpage in the microelectronic package by the stiffener.

20 Claims, 6 Drawing Sheets

(56) References Cited

U.S. PATENT DOCUMENTS

| | | | |
|---|---|---|---|
| 2004/0212051 A1 | 10/2004 | Zhao et al. | |
| 2005/0062143 A1* | 3/2005 | Joshi | H01L 23/36 |
| | | | 257/678 |
| 2016/0079135 A1* | 3/2016 | Huang | H01L 23/49827 |
| | | | 257/777 |

* cited by examiner

STIFFENER FOR PROVIDING UNIFORMITY IN MICROELECTRONIC PACKAGES

TECHNICAL FIELD

The present disclosure relates generally to microelectronic packages, and more particularly, to providing uniformity by controlling flatness in microelectronic packages.

BACKGROUND

Integrated circuits are typically packaged prior to use in a larger circuit to protect the integrated circuits and provide interconnection with other parts of the larger circuit. Stiffeners are often integrated on a substrate of a microelectronic package to provide mechanical support and warpage management during packaging processes.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
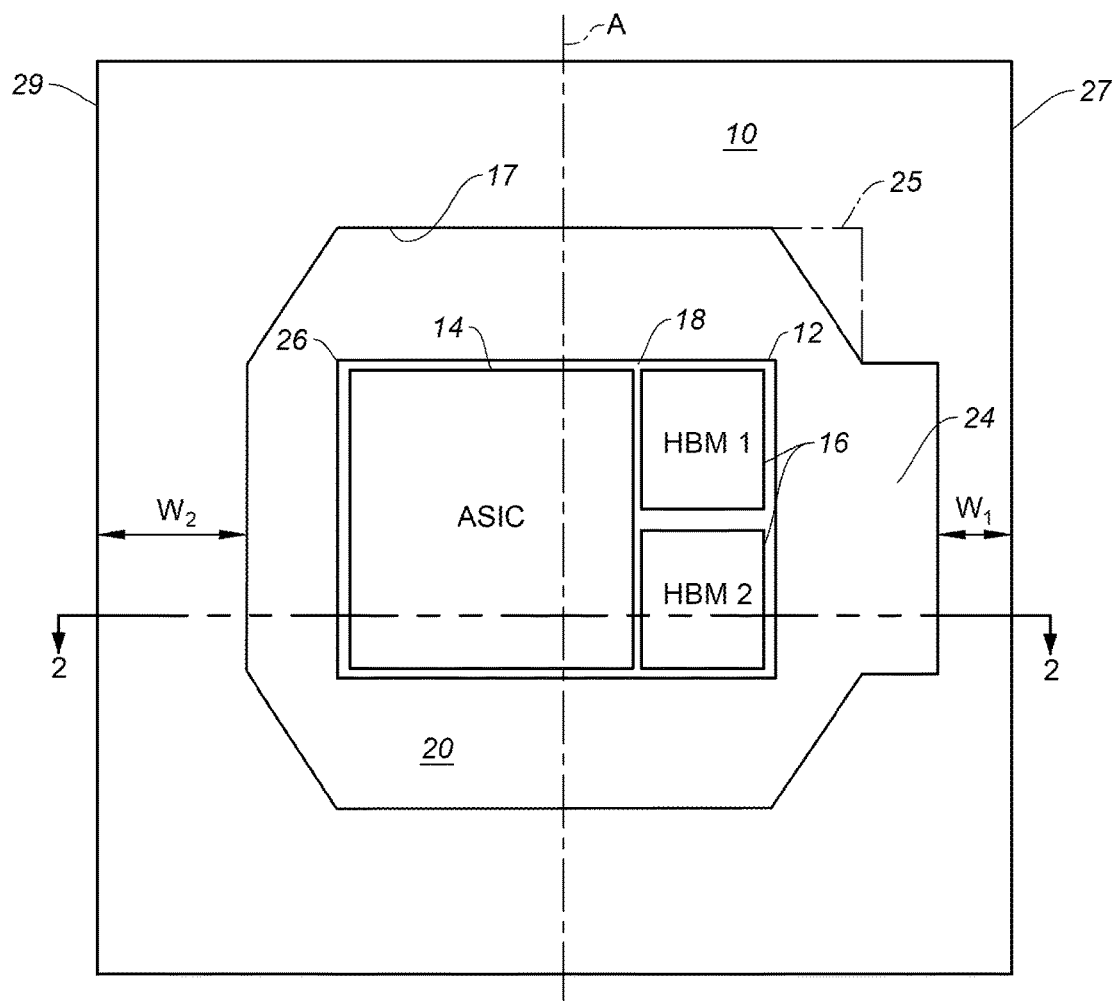
FIG. 1 is a top view of a microelectronic package with a stiffener, in accordance with one embodiment.

In one embodiment, an apparatus generally comprises a microelectronic package comprising a plurality of semiconductor chips connected to a substrate and a stiffener mounted on the substrate. The stiffener is mounted on the substrate with the semiconductor chips disposed within an opening in the stiffener and the opening defines an asymmetric shape relative to the semiconductor chips to control overall warpage in the microelectronic package by the stiffener.

In another embodiment, an apparatus generally comprises a microelectronic package comprising a plurality of semiconductor chips and a stiffener mounted on a substrate of the microelectronic package and comprising an opening, the semiconductor chips disposed in the opening. A layout of the semiconductor chips in the microelectronic package is asymmetric and at least a portion of one edge margin of the stiffener is narrower than an opposing edge margin of the stiffener to reduce overall warpage of the microelectronic package during a packaging process.

In yet another embodiment, an apparatus generally comprises a 2.5D microelectronic package comprising a plurality of semiconductor chips mounted on an interposer connected to a substrate, the semiconductor chips comprising at least two different sizes of semiconductor chips and wherein a layout of the chips is asymmetric about an axis parallel to an edge of the interposer, a stiffener mounted on the substrate and comprising an opening for receiving the semiconductor chips, and a printed circuit board with the microelectronic package mounted thereon. The opening is asymmetric about the axis to control overall flatness of the microelectronic package.

EXAMPLE EMBODIMENTS

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Semiconductor chips (die, integrated circuits, chips, silicon chips, ASIC (Application Specific Integrated Circuits), memory chips, HBM (High Bandwidth Memory) chips, etc.) are often provided in packages (also referred to as microelectronic packages, integrated circuit packages, or semiconductor packages) that facilitate handling of the chips during manufacture and mounting of the chips on an external substrate such as a circuit board. It is important to maintain flatness throughout the packaging process. If a package substrate is allowed to flex to an excessive degree after the electronic components are mounted, the mechanical stresses inherent in the flexing may be transferred to and damage the electronic components.

Next generation chip designs utilizing multi-chip modules or multi-dimensional (e.g., 2.5D (dimensional), 3D) construction are increasingly used to meet high performance demands. These packages may warp more than conventional packages due to interactions between materials in the package. While warpage is inevitable for systems built with different materials due to both material and structural mismatch, the packages comprising multiple die are more susceptible to warpage due to the interfaces between different materials in the package. Package lids, which are often coupled to an upper side of the packaging substrate, may be used to provide co-planarity and ensure reliability of interconnects, however, the lids have a negative impact on thermal performance and limit the power capability of the microelectronic package.

The embodiments described herein provide stiffener designs for multi-dimensional (e.g., 2.5D, 3D, 2.5D/3D) and other thermally enhanced microelectronic packages. As described below, the stiffener is configured to account for an asymmetric (non-uniform) semiconductor chip layout. Localized, asymmetric thinning (or thickening) of one or more edge margins of the stiffener is used to control warpage (provide uniformity, control flatness) in the asymmetric package design. The stiffener reduces the overall warpage for microelectronic packages without impacting thermal performance. The unique stiffener geometry saves space, cost, and improves thermal performance, while significantly reducing warpage in microelectronic packages in which a lid cannot be used due to thermal cooling constraints.

Figure 2:
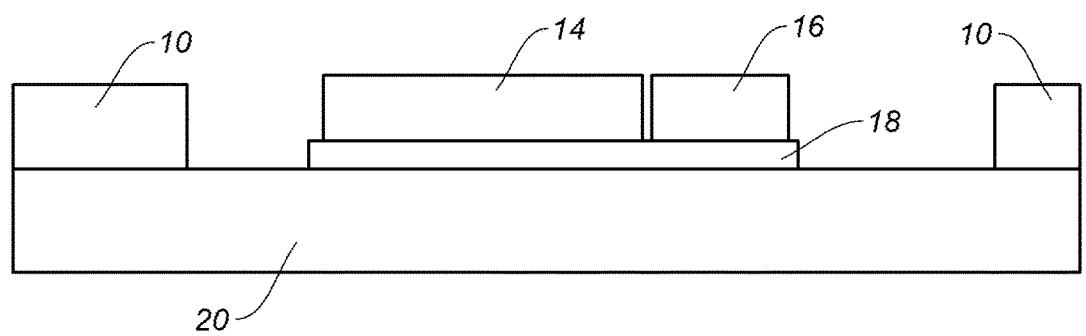
FIG. 2 is a sectional view along line 2-2 of FIG. 1.

Referring now to the drawings and first to FIG. 1, a top view of a stiffener 10 on a microelectronic package 12 is shown, in accordance with one embodiment. In one example, the microelectronic package 12 comprises a 2.5D integrated circuit package comprising an ASIC (Application Specific Integrated Circuit) chip 14 and two HBM (High Bandwidth Memory) chips (HBM 1, HBM 2) 16 with chip-to-chip channels. FIG. 2 is a sectional view taken along line 2-2 of FIG. 1. In the example shown in FIGS. 1 and 2, the semiconductor chips 14, 16 are mounted on a silicon interposer 18, which is mounted on a substrate 20. As described below with respect to FIG. 5, the package design (e.g., chip layout (number, type, and arrangement of chips), 2.5D, 3D, or other construction) may be different than shown herein without departing from the scope of the embodiments.

The stiffener 10 is configured to provide uniform flatness across the package 12 without the need for a lid, which would limit thermal cooling characteristics of the package. The stiffener 10 provides improved mechanical support (rigidity support) and warpage management during chip assembly by increasing the structural strength of the package substrate 20, which may be a relatively thin, flexible structure. In one embodiment, the interposer 18 may maintain flatness in a central region of the package while the stiffener 10 controls warpage from a periphery of the substrate 20 to reduce bending stress in the substrate during thermal cycling. The stiffener 10 is configured to counteract CTE (Coefficient of Thermal Expansion) mismatch induced warpage between the silicon chips 14, 16, the interposer 18, and the substrate 20. The stiffener shape is optimized to adjust the interaction between the package and stiffener 10 to provide improved co-planarity. As described below, through selection and design of the material and geometry of the stiffener 10, the stiffener can be designed to control the flatness of the package during packaging and assembly. FEA (Finite Element Analysis) may be used to evaluate warpage due to material, geometry, or both material and geometry and optimize the stiffener shape.

In one embodiment, the stiffener 10 is formed in an asymmetric shape relative to the semiconductor chips 14, 16 to reduce the overall warpage in a microelectronic package 12 with an asymmetric layout of semiconductor chips. In the example shown in FIG. 1, the package 12 includes one large ASIC chip 14 mounted on one side of the package (edge of interposer) and two smaller memory chips 16 mounted next to the ASIC on another side of the package. Due to the different chip sizes, the layout is asymmetric relative to a central plan vertical axis A, as viewed in FIG. 1.

In the example shown in FIG. 1, the stiffener 10 is designed in an asymmetric shape about axis A to reduce warpage on the ASIC side without over reducing warpage on the HBM side, thus providing a reduction in overall warpage (difference between the minimum and maximum values). As shown in the example of FIG. 1, a cutout 24 extends from a side of central opening 17 in the stiffener such that at least a portion of one edge margin 27 is thinner than an opposing edge margin 29 (width $W_1$<width $W_2$), thus providing an asymmetric stiffener design.

As shown in FIGS. 1 and 2, the stiffener 10 comprises a flat piece of material that has an opening 17 formed in a central portion of the stiffener. The stiffener 10 is attached to the package substrate 20 with the electronic components 14, 16 (chips, die, integrated circuits, ASIC, memory, HBM, FCBGA (Flip Chip Ball Grid Array)) located within the opening 17 of the stiffener. The exposed silicon die accommodates enhanced thermal properties.

The stiffener 10 comprises a piece of relatively rigid material, such as a flat piece of metal. In one or more embodiments, the stiffener is formed from steel to provide improved thermomechanical rigidity. Although other materials such as copper or ceramics may also be used. In one embodiment, the stiffener 10 is formed from steel (steel plate) with a modulus of elasticity of at least 200E6 KPa and CTE of 15.1 ppm/K (or any other suitable properties). The high modulus of the stiffener 10 prevents expansion and shrinkage of the substrate 20. Through suppression of the bending of the substrate 20, the overall mechanical reliability of the package is improved.

In the example shown in FIG. 1, the central opening 17 is formed in an octagonal shape (leaving triangular portions of the stiffener located at each corner of the opening intact (outlined in phantom at 25)) to allow the edges of the opening to be located near corners 26 of the interposer 18. It is to be understood that the octagonal shape of the central opening 17 shown in FIG. 1 is only an example and that the number of sides of the central opening may be increased or decreased, without departing from the scope of the embodiments. For example, as shown in FIG. 3, a central opening 37 may be rectangular in shape with the triangular portions 25 of the stiffener shown in FIG. 1 removed.

Figure 3:
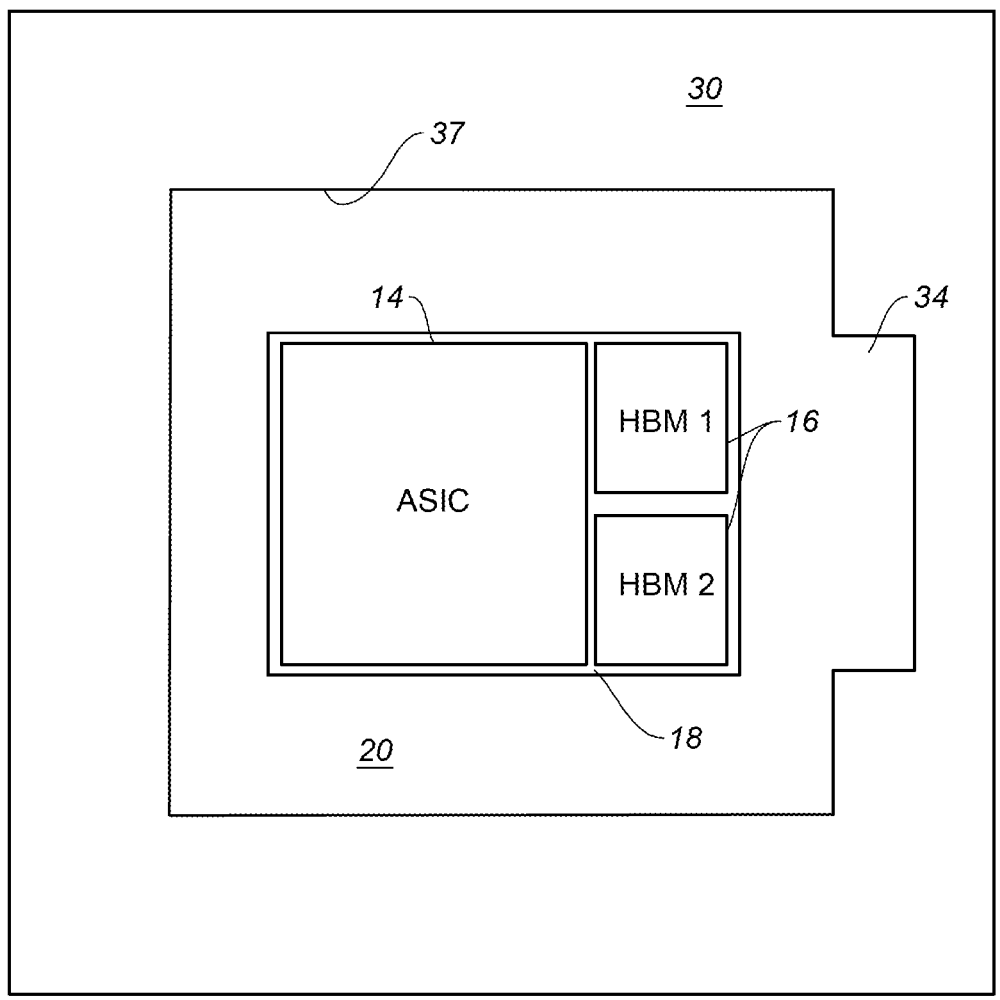
FIG. 3 is a top view of another example of a stiffener on the microelectronic package.

As shown in FIGS. 1 and 3, a rectangular cutout 24, 34 (outlined in phantom in FIG. 1) extends from one side of the central opening 17 (or a portion of one side of central opening 37) to reduce negative warpage along one side, while at the same time reducing positive warpage at the corners of the package. The rectangular cutout 24, 34 extends the central opening 17, 37 along at least a portion of one edge of the opening adjacent to the interposer 18 to define an asymmetric opening in the stiffener. This results in at least a portion of one edge margin 27 being narrower than an opposing edge margin 29 of the stiffener to reduce overall warpage of the microelectronic package during a packaging process.

In the examples shown in FIGS. 1 and 3, the rectangular cutout 24, 34 is adjacent to the edge of the interposer 18 on which the memory chips 16 are mounted to reduce the negative warpage along this side. In this example, the larger ASIC chip 14 results in higher warpage and the wider edge margin 29 reduces this warpage. Since the opposite side has smaller memory chips 16 mounted thereon, a narrower edge margin 27 is needed to reduce the warpage as compared to the ASIC side. It is to be understood that the rectangular cutout 24, 34 may be a different shape or size than shown or located on a different side of the package depending on the chip layout, without departing from the scope of the embodiments.

Figure 4:
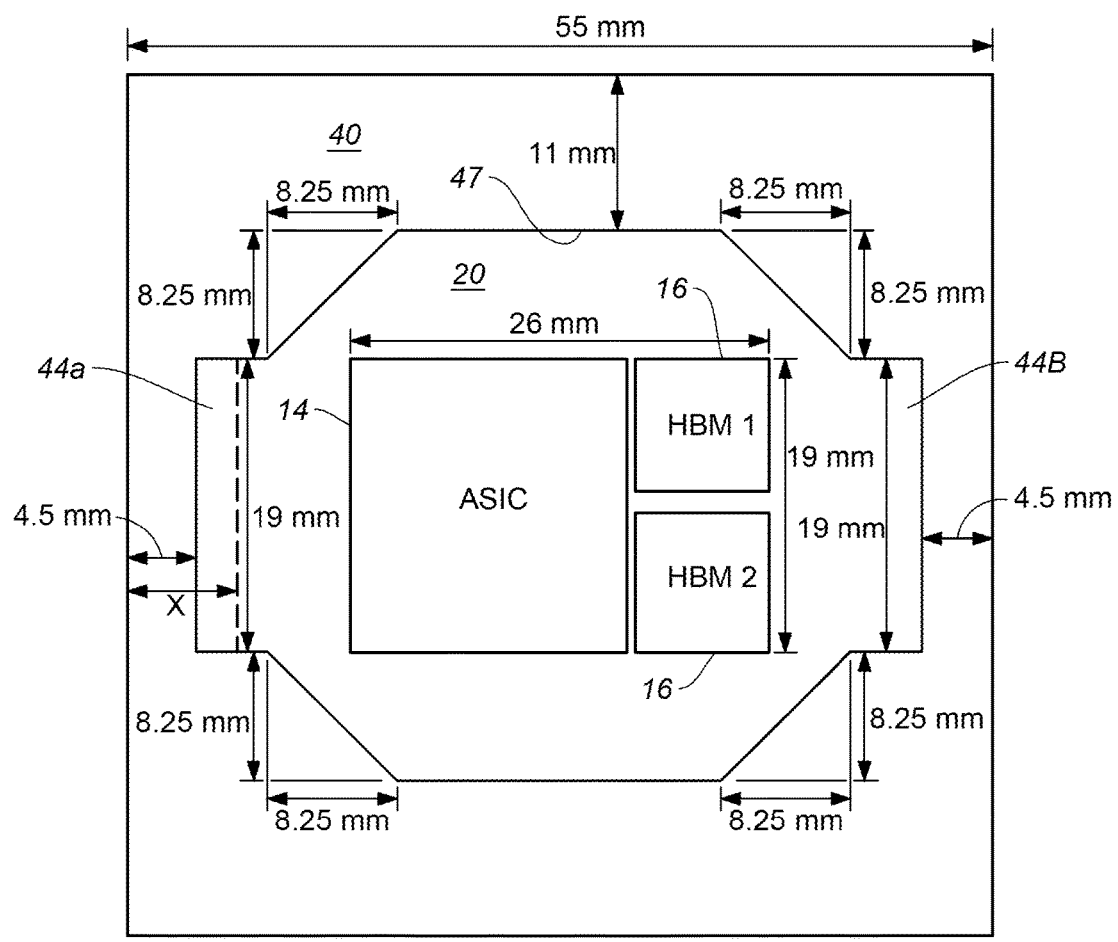
FIG. 4 is a top view of another example of a stiffener on the microelectronic package.

FIG. 4 shows another example of a stiffener 40 in which rectangular cutouts 44a, 44b extend from two sides of a central opening 47. The shape or size of the two cutouts may be modified as needed to control flatness. For example, if the warpage varies due to the non-uniform layout of the chips, as previously described, cutout 44a on the ASIC side may be reduced in size (e.g., horizontal width x of stiffener edge increased as shown in FIG. 4) as needed to meet co-planarity requirements.

In one example, the stiffener is 0.7 mm thick, although the plate may be any other suitable thickness to provide a minimum required co-planarity. The dimensions shown in FIG. 4 are provided only as an example and one or more of the dimensions may be different than shown based on the electronic package size and material, number, size, and arrangement of semiconductor chips, and stiffener size, material, and shape.

The stiffener 10 may comprise a flat plate mounted on the substrate 20 as shown in FIG. 2 or the stiffener may comprise a mounting portion (e.g., periphery edge of the stiffener) that is mounted on the substrate with the rest of the stiffener spaced from the substrate (e.g., 0.9 mm or any other distance). Also, the stiffener 10 may be a continuous plate as shown in FIG. 1 or may comprise a perforated plate (e.g., comprising a plurality of spaced openings (round or other shape)) for weight reduction or enhanced cooling as long as the perforated plate provides sufficient stiffness for controlling flatness of the package.

Figure 5:
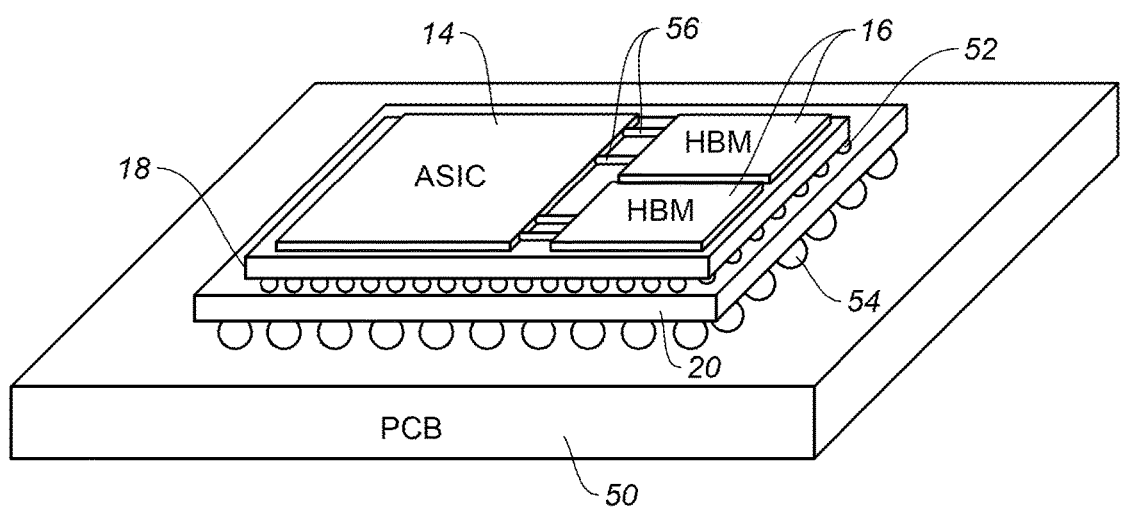
FIG. 5 is a perspective of the microelectronic package in the example of FIGS. 1-4 mounted on a printed circuit board with the stiffener removed to show detail.

FIG. 5 illustrates an example of a 2.5D electronic package mounted on a PCB (printed circuit board) 50 with the stiffener removed to show details of the microelectronic package. In the example shown in FIG. 5, the 2.5D package includes an ASIC chip 14 and two HBM chips 16 mounted on a silicon interposer 18 (or other suitable bridge material (e.g., ceramic, glass)), which is mounted on a substrate 20. This allows memory 16 to be mounted close to the ASIC 14. The substrate 20 is mounted on the PCB 50.

In this example, the silicon interposer 18 is mounted on the substrate 20 with bumps (e.g., solder bumps, flip chip bumps) 52 and the substrate is mounted on the PCB 50 with package bumps 54. The die 14, 16 may be mounted on the interposer 18 with micro-bumps (not shown). The chips 14, 16 may be connected with any number of chip interconnects 56. The silicon interposer 18 may include any number of TSVs (through-silicon vias) (or other through vias) (not shown), which are vertical electrical connections passing through the substrate and connecting upper layers to backside layers. In one example, the microelectronic package comprises a large FCBGA package, however, the embodiments described herein may be implemented for other types of chips or microelectronic packages.

As shown in FIG. 5, the ASIC chip 14 is larger in size than the HBM chips 16, thus leading to a layout of the chips that is asymmetric along at least one axis parallel to an edge of the interposer 18 (e.g., about axis A in FIG. 1). This non-uniform (asymmetric) chip layout results in a need for an asymmetric stiffener to reduce overall warpage in the microelectronic package, as previously described.

It is to be understood that the type, number, and arrangement of chips shown in FIGS. 1-5 is only an example and that the microelectronic package may include any number, type, or arrangement of semiconductor chips. Also, the embodiments described herein may be used with conventional packages (e.g., single die) or other multi-dimensional packages (e.g., 3D package (vertical stacking) or combination of 2.5D and 3D (e.g., additional layer of die stacked on the 2.5D package).

Figure 6:
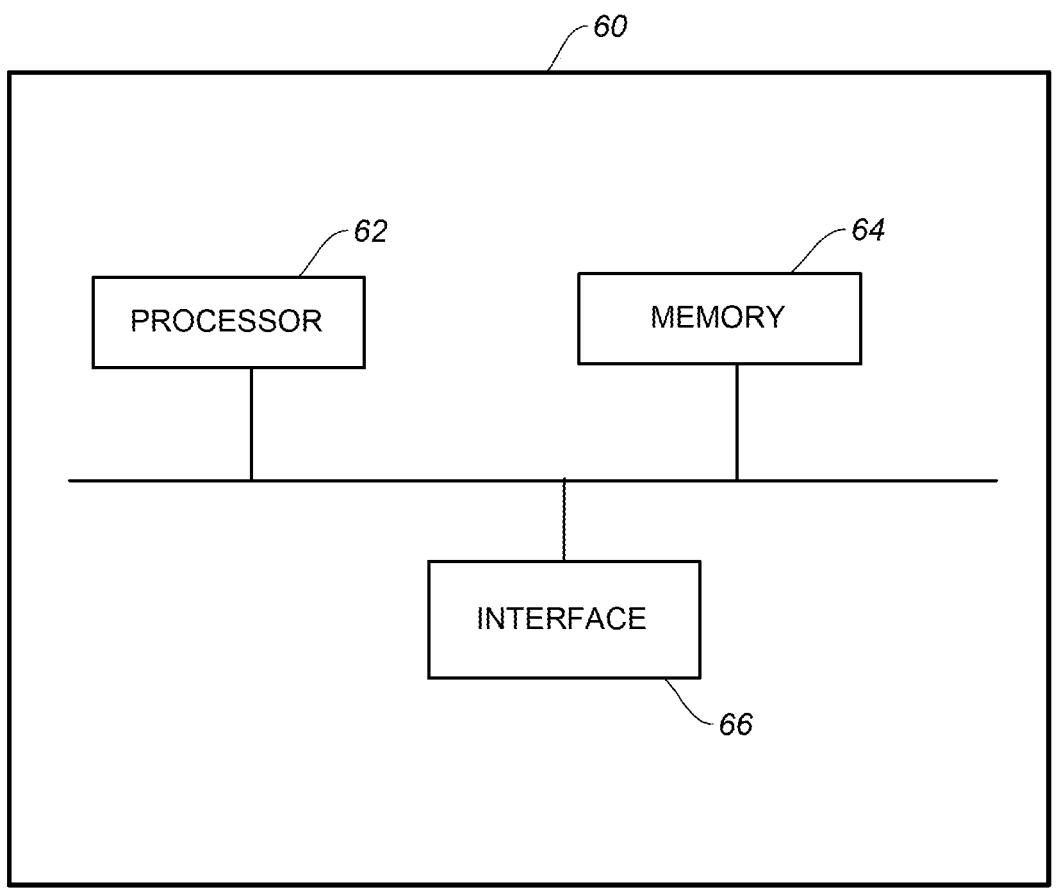
FIG. 6 illustrates an example of a network device in which the embodiments described herein may be implemented.

The embodiments described herein may operate in the context of a network device as shown in the block diagram of FIG. 6. In one embodiment, the network device 60 is a programmable machine that may be implemented in hardware, software, or any combination thereof. The network device 60 includes one or more processor 62, memory 64, and network interface (port) 66.

Memory 64 may be a volatile memory or non-volatile storage, which stores various applications, operating systems, modules, and data for execution and use by the processor 62. The network device 60 may include any number of memory components.

Logic may be encoded in one or more tangible media for execution by the processor 62. For example, the processor 62 may execute codes stored in a computer-readable medium such as memory 64. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 62 may process data received from the interface 66. The network device 60 may include any number of processors 62.

The network interface 66 may comprise any number of interfaces (linecards, ports) for receiving data or transmitting data to other devices. The network interface 66 may include, for example, an Ethernet interface for connection to a computer or network or a wireless interface.

It is to be understood that the network device 60 shown in FIG. 6 and described above is only an example and that the embodiments described herein may be implemented in different configurations of network devices. For example, the network device 60 may further include any suitable combination of hardware, software, algorithms, processors, devices, components, or elements.

Although the apparatus has been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. An apparatus comprising:
a microelectronic package comprising a plurality of semiconductor chips connected to a substrate; and
a stiffener mounted on the substrate with the semiconductor chips disposed within an opening in the stiffener;
wherein said opening defines an asymmetric shape relative to the semiconductor chips to control overall warpage in the microelectronic package by the stiffener and wherein said opening comprises a rectangular opening with a rectangular cutout extending along at least a portion of said rectangular opening.

2. The apparatus of claim 1 wherein said plurality of semiconductor chips are connected to the substrate by an interposer and the microelectronic package comprises a 2.5 dimensional design.

3. The apparatus of claim 2 wherein said plurality of semiconductor chips are arranged in an asymmetric layout on the interposer.

4. The apparatus of claim 1 wherein said cutout defines at least a portion of an edge margin of the stiffener that is thinner than an opposing edge margin of the stiffener.

5. The apparatus of claim 1 wherein said cutout defines at least a portion of an edge margin of the stiffener that is thinner than all other edge margins of the stiffener.

6. The apparatus of claim 1 wherein said opening comprises a second cutout on an opposite side of said opening.

7. The apparatus of claim 1 wherein the semiconductor chips comprise at least one application specific integrated circuit (ASIC) chip and at least two memory chips and wherein said cutout is disposed adjacent to the memory chips.

8. The apparatus of claim 1 wherein the stiffener comprises a steel plate.

9. The apparatus of claim 8 wherein the steel plate has a modulus of elasticity of at least 200E6 KPa.

10. An apparatus comprising:
a microelectronic package comprising a plurality of semiconductor chips; and
a stiffener mounted on a substrate of the microelectronic package and comprising an opening, the semiconductor chips disposed in said opening;
wherein a layout of the semiconductor chips in the microelectronic package is asymmetric and wherein at least a portion of one edge margin of the stiffener is narrower than an opposing edge margin of the stiffener to reduce overall warpage of the microelectronic package during a packaging process, and wherein said opening comprises an octagonal shaped opening with a rectangular cutout extending from one side of said opening.

11. The apparatus of claim 10 wherein a number of the semiconductor chips located adjacent to one side of said opening is different than a number of the semiconductor chips located adjacent to an opposite side of said opening.

12. The apparatus of claim 10 wherein the stiffener is mounted on a periphery edge of the substrate.

13. The apparatus of claim 10 wherein the stiffener comprises a steel plate.

14. The apparatus of claim 10 wherein said opening comprises a second cutout on an opposite side of said opening.

15. The apparatus of claim 10 wherein the semiconductor chips comprise at least one application specific integrated circuit (ASIC) chip and at least two memory chips and wherein said cutout is disposed adjacent to the memory chips.

16. An apparatus comprising:
a 2.5 dimensional microelectronic package comprising a plurality of semiconductor chips mounted on an interposer connected to a substrate, the semiconductor chips comprising at least two different sizes of semiconductor chips and wherein a layout of the chips is asymmetric about an axis parallel to an edge of the interposer;
a stiffener mounted on the substrate and comprising an opening for receiving the semiconductor chips; and
a printed circuit board with the microelectronic package mounted thereon;
wherein said opening is asymmetric about said axis to control overall flatness of the microelectronic package by the stiffener and wherein said opening comprises an octagonal shaped opening with a rectangular cutout extending from one side of said opening.

17. The apparatus of claim 16 wherein the semiconductor chips comprise at least one application specific integrated circuit (ASIC) chip and at least two memory chips and wherein the stiffener is narrower at an edge margin adjacent to the memory chips.

18. The apparatus of claim 16 wherein the stiffener comprises a steel plate.

19. The apparatus of claim 16 wherein a number of the semiconductor chips located adjacent to one side of said opening is different than a number of the semiconductor chips located adjacent to an opposite side of said opening.

20. The apparatus of claim 16 wherein the stiffener is mounted on a periphery edge of the substrate.

* * * * *